United States Patent
Fan et al.

(10) Patent No.: US 10,615,255 B2
(45) Date of Patent: Apr. 7, 2020

(54) FIN FORMATION FOR SEMICONDUCTOR DEVICE

(71) Applicants: International Business Machines Corporation, Armonk, NY (US); STMicroelectronics, Inc., Coppell, TX (US); Samsung Electronics Co., Ltd., Gyeonggi-do (KR)

(72) Inventors: Susan S. Fan, Cohoes, NY (US); Dongseok Lee, Hwaseong-si (KR); David Moreau, Pflugerville, TX (US); Tenko Yamashita, Schenectady, NY (US)

(73) Assignees: INTERNATIONAL BUSINESS MACHINES CORPORATION, Armonk, NY (US); STMICROELECTRONICS, INC., Coppell, TX (US); SAMSUNG ELECTRONICS CO., LTD. (KR)

( * ) Notice: Subject to any disclaimer, the term of this patent is extended or adjusted under 35 U.S.C. 154(b) by 53 days.

(21) Appl. No.: 15/042,737

(22) Filed: Feb. 12, 2016

(65) Prior Publication Data
US 2017/0236722 A1    Aug. 17, 2017

(51) Int. Cl.
| | |
|---|---|
| *H01L 21/84* | (2006.01) |
| *H01L 29/06* | (2006.01) |
| *H01L 21/308* | (2006.01) |
| *H01L 21/8234* | (2006.01) |
| *H01L 21/02* | (2006.01) |
| *H01L 21/3065* | (2006.01) |
| *H01L 21/306* | (2006.01) |

(52) U.S. Cl.
CPC ...... *H01L 29/0657* (2013.01); *H01L 21/3081* (2013.01); *H01L 21/823431* (2013.01); *H01L 21/02236* (2013.01); *H01L 21/3065* (2013.01); *H01L 21/30608* (2013.01); *H01L 21/845* (2013.01)

(58) Field of Classification Search
CPC ..... H01L 21/823431; H01L 21/823821; H01L 29/66795; H01L 29/785; H01L 27/0886; H01L 27/1211; H01L 29/7851; H01L 29/7853; H01L 29/7854; H01L 21/845; H01L 29/66818
See application file for complete search history.

(56) References Cited

U.S. PATENT DOCUMENTS

| | | | |
|---|---|---|---|
| 8,617,961 B1 | 12/2013 | Haran et al. | |
| 8,617,996 B1 * | 12/2013 | Chi | H01L 21/30604 257/E21.377 |

(Continued)

*Primary Examiner* — Monica D Harrison
*Assistant Examiner* — John Lin
(74) *Attorney, Agent, or Firm* — Cantor Colburn LLP; Alvin Borromeo (57) ABSTRACT

A method of fabricating a semiconductor structure includes forming a plurality of semiconductor fins disposed on a semiconductor substrate, wherein at least one of the fins is an unwanted fin including a semiconductor material; providing a conformal protective layer over the plurality of semiconductor fins; forming a mask having an opening over the unwanted fin; removing a portion of the unwanted fin to expose a fin spike; oxidizing the fin spike to form an oxidized semiconductor material; and removing the oxidized semiconductor material to expose a fin base.

19 Claims, 6 Drawing Sheets

(56) References Cited

U.S. PATENT DOCUMENTS

| | | | |
|---|---|---|---|
| 8,658,536 B1* | 2/2014 | Choi | H01L 21/308 |
| | | | 257/E21.409 |
| 8,703,557 B1 | 4/2014 | Cai et al. | |
| 8,906,807 B2 | 12/2014 | Bergendahl et al. | |
| 9,147,730 B2 | 9/2015 | Xie et al. | |
| 2009/0269918 A1* | 10/2009 | Ma | H01L 21/324 |
| | | | 438/591 |
| 2014/0024198 A1* | 1/2014 | Haran | H01L 21/76283 |
| | | | 438/404 |
| 2015/0279959 A1 | 10/2015 | Qi et al. | |
| 2015/0279971 A1 | 10/2015 | Xie et al. | |

* cited by examiner

FIN FORMATION FOR SEMICONDUCTOR DEVICE

BACKGROUND

The present invention generally relates to metal-oxide-semiconductor field-effect transistors (MOSFET), and more specifically, to FINFET interconnect technology.

The MOSFET is a transistor used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the path from drain to source is an open circuit ("off") or a resistive path ("on").

N-type field effect transistors (nFET) and p-type field effect transistors (pFET) are two types of complementary MOSFETs. The nFET uses electrons as the current carriers and with n-doped source and drain junctions. The pFET uses holes as the current carriers and with p-doped source and drain junctions.

In contrast to traditional planar metal-oxide-semiconductor, field-effect transistors (MOSFETs), which are fabricated using conventional lithographic fabrication methods, non-planar FETs incorporate various vertical transistor structures. One such semiconductor structure is the "FINFET", which takes its name from the multiple semiconductor "fins" that are used to form the respective gate channels, and which are typically on the order of tens of nanometers in width. Advantageously, the fin structure helps to control current leakage through the transistor in the off stage, and a double gate or tri-gate structure may be employed to control short channel effects.

The FINFET is a type of MOSFET. The FINFET is a double-gate or multiple-gate MOSFET device that mitigates the effects of short channels and reduces drain-induced barrier lowering. The "fin" refers to the narrow channel between source and drain regions. A thin dielectric layer on either side of the fin separates the fin channel from the gate.

Gate spacers form an insulating film along gate sidewalls. Gate spacers may also initially be formed around "dummy" gate sidewalls in replacement gate technology. The gate spacers are used to define source/drain regions in active areas of a semiconductor substrate located slightly away from the gate.

FINFET structures require the formation of fin structure through (1) formation of fins through an array of fins, also known as a sea of fins for CD control purpose and (2) removal of unwanted fins outside the active areas. When scaling the FINFET structures beyond the 10 nanometer (nm) node, the fin pitch is expected to be below 40 nm, making the removal of the fins (fins cut) challenging. As the fin pitch scales to a sub 40 nm dimension, the margin to completely remove the unwanted fins is very minimal, leaving with conventional fin cut approaches some silicon spikes.

Thus, there remains a need for an enhanced fin cut process, for example, for use during FINFET device fabrication, which does not leave unwanted fin residue or result in excessive semiconductor removal.

SUMMARY

An embodiment provides a method of fabricating a semiconductor structure, including: forming a plurality of semiconductor fins disposed on a semiconductor substrate, wherein at least one of the fins is an unwanted fin including a semiconductor material; providing a conformal protective layer over the plurality of semiconductor fins; forming a mask having an opening over the unwanted fin; removing a portion of the unwanted fin to expose a fin spike; oxidizing the fin spike to form an oxidized semiconductor material; and removing the oxidized semiconductor material to expose a fin base.

Another embodiment provides a method of fabricating a semiconductor structure, including: forming a plurality of semiconductor fins disposed on a semiconductor substrate, wherein at least one of the fins is an unwanted fin including a semiconductor material; providing a conformal protective layer over the plurality of semiconductor fins; forming a mask having an opening over the unwanted fin; removing a portion of the conformal protective layer over the unwanted fin exposed through the opening; removing a portion of the unwanted fin exposed through the opening to expose a fin spike; oxidizing the fin spike to form an oxidized semiconductor material; and removing the oxidized semiconductor material to expose a fin base.

Yet another embodiment provides a semiconductor device, including: a substrate extending in a first direction to define a substrate length and a second direction perpendicular to the first direction to define a substrate width; a first semiconductor fin formed on an upper surface of the substrate, the first semiconductor fin extending along the second direction; a second semiconductor fin formed on an upper surface of the substrate, the second semiconductor fin extending along the second direction; and a third semiconductor fin formed on an upper surface of the substrate and disposed between the first semiconductor fin and the second semiconductor fin, wherein the third semiconductor fin extends along the second direction at a first distance from the first semiconductor fin and at a second distance from the second semiconductor fin, wherein the first distance and the second distance are different.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying invention will be apparent to those skilled in the art from this disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" another element, there are no intervening elements present, and the element is in contact with another element.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Reference is made below to the drawings, which are not drawn to scale for ease of understanding, wherein the same reference numbers used throughout different figures designate the same or similar components.

Figure 1A:
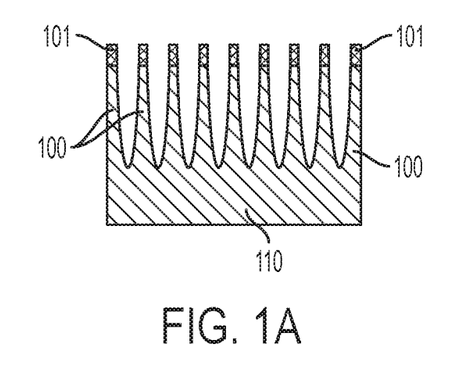
FIG. 1A depicts an embodiment of an intermediate structure including multiple fins obtained during bulk FINFET formation, in accordance with one or more aspects of the present disclosure.

FIG. 1A depicts an embodiment of an intermediate structure obtained during bulk FINFET formation, wherein multiple fins 100 reside on a substrate 110, which includes a semiconductor material. Non-limiting examples of suitable substrate materials include Si (silicon), strained Si, SiC (silicon carbide), Ge (germanium), SiGe (silicon germanium), SiGeC (silicon-germanium-carbon), Si alloys, Ge alloys, GaAs (gallium arsenide), InAs (indium arsenide), InP (indium phosphide), or any combination thereof. Other examples of suitable substrates include silicon-on-insulator (SOI) substrates with buried oxide (BOX) layers. In some embodiments, the semiconductor material of the fins 100 and the semiconductor material of the substrate 110 may be the same or different. In other embodiments, the material forming the fins and the substrate may be silicon, germanium, silicon germanium, or a combination thereof.

The fins 100 may be formed in the substrate 110 by depositing a hard mask 101 material over the substrate 110. The fins 100 may be patterned, for example, by sidewall imaging transfer.

In some aspects, the fins 100 have a height in a range from about 20 to about 200 nanometers (nm) and a width in a range from about 20 to about 200 nm. In other aspects, the fins 100 have a height in a range from about 50 to about 100 nm and a width in a range from about 5 to about 30 nm. The fin height and width may generally vary, as it depends on the type of device, and is not intended to be limited.

Figure 1B:
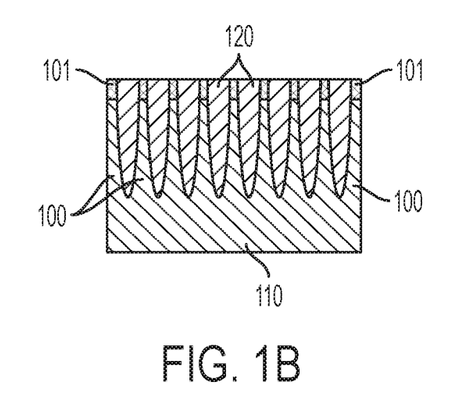
FIG. 1B depicts the intermediate structure of FIG. 1A after provision of a planarization material over the multiple fins, in accordance with one or more aspects of the present disclosure.
Figure 1C:
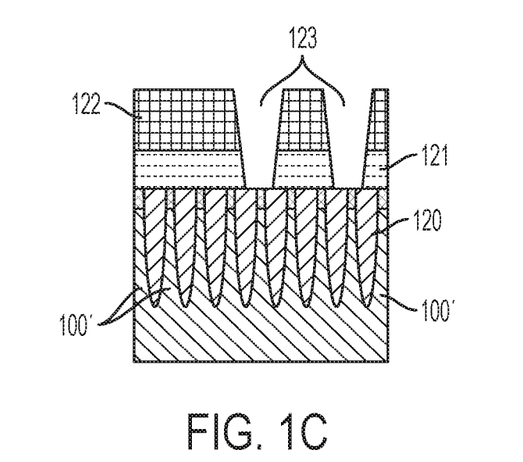
FIG. 1C depicts the intermediate structure of FIG. 1B after provision of an anti-reflective coating and patterning of a photoresist to provide an opening over one or more unwanted fins, in accordance with one or more aspects of the present disclosure.

A hard mask 101 resides at the top of each fin 100. In an example, the hard mask 101 may include silicon nitride (SiN), SiOCN, SiNO, or SiBCN. As illustrated, the fins 100 are spaced apart, and during bulk FINFET fabrication processing, more fins may have been created than required for a particular circuit or device. Thus, a bulk fin cut or fin removal process is employed to remove one or more unwanted fins from the intermediate structure. This is achieved by providing a planarization material 120 over the fins 100 (FIG. 1B), and by providing an anti-reflective coating 121 and photoresist 122 over the planarization material (FIG. 1C). An opening 123 is patterned into photoresist 122 over unwanted fins 100 in this example.

Figure 1D:
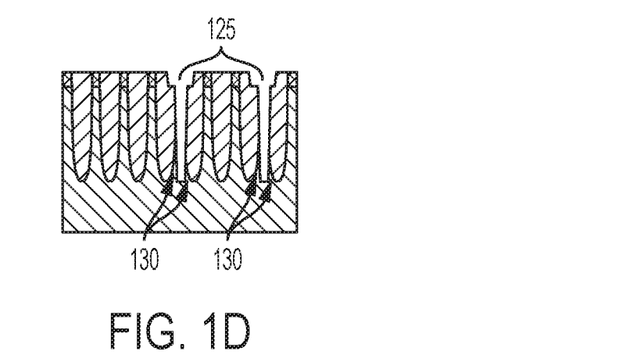
FIG. 1D depicts the intermediate structure of FIG. 1C after unselective removal of planarization material, hard mask, and the unwanted fins, in accordance with one or more aspects of the present disclosure.
Figure 1E:
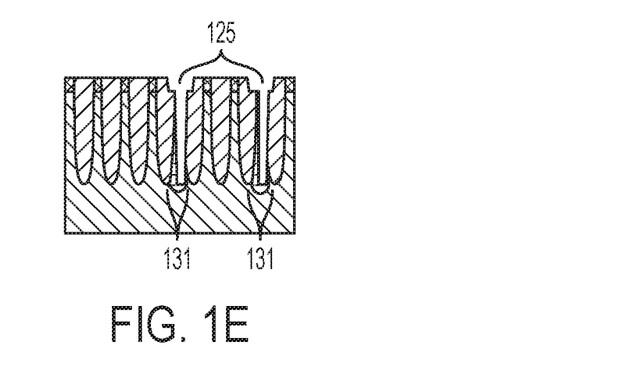
FIG. 1E depicts the intermediate structure of FIG. 1D after the oxidation of the remaining semiconductor material spikes, in accordance with one or more aspects of the present disclosure.
Figure 1F:
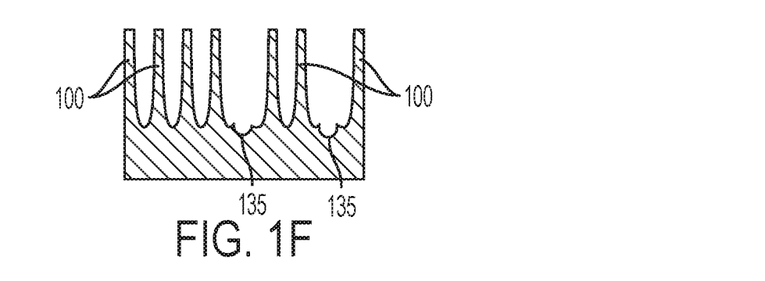
FIG. 1F depicts the intermediate structure of FIG. 1E after the removal of the planarization material, and the oxidized semiconductor material of the spikes.
Figure 1G:
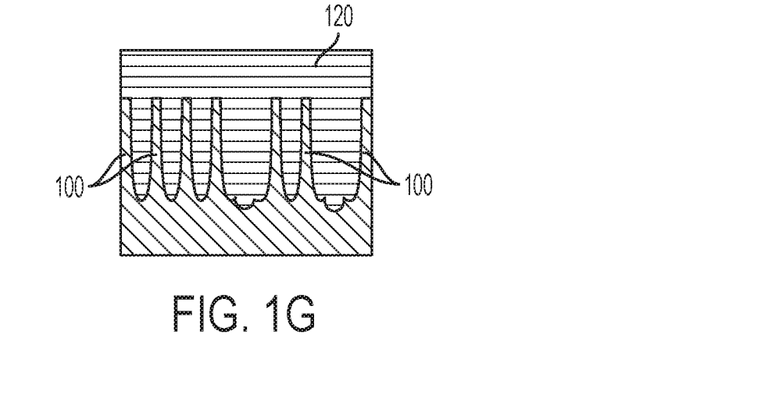
FIG. 1G depicts the intermediate structure of FIG. 1F after re-filling the fin trenches with planarization material.

As illustrated in FIG. 1D, a one-step fin cut selective to the planarization material may then be performed through an opening 125, and when the fin cut time process is under-timed or on target, semiconductor spikes (fence regions) 130 may remain as a shadow. In an embodiment, the planarization material may be an optical planarization layer (OPL) or optical dispersive layer (ODL), which during the timed etching, blocks the semiconductor etch, causing the illustrated fin spikes 130 in the semiconductor material. In an example, the semiconductor material may be silicon, and the planarization material may be an organic fill material. An oxidation process may then be performed to oxidize the remaining spikes 130 of the unwanted fins in the openings 123 and 125 of the photoresist pattern into oxidized fin spikes 131 (FIG. 1E). In an example, the oxidation may be conducted by steam oxidation, such as thermal anneal (with water vapor) or plasma (with oxygen in). When the remaining spikes include silicon, the oxidized fin spikes may include silicon oxide. Then, the planarization material 120 may be removed and the oxidized fin spikes 131 may also be removed to expose a fin base 135 (FIG. 1F). A new portion of the planarization material 120 may be subsequently provided to fill out the fin trenches (FIG. 1G).

Generally stated, disclosed herein is an enhanced fin cut processing that can be accomplished with minimal FINFET residue and minimal unwanted recessing. The fin cut processing disclosed is selective, and can be integrated with existing FINFET device fabrication processing. The method includes, in one aspect:

providing a conformal protective layer over the plurality of semiconductor fins;

forming a mask having an opening over the unwanted fin;

removing a portion of the unwanted fin to expose a fin spike;

oxidizing the fin spike to form an oxidized semiconductor material; and removing the oxidized semiconductor material to expose a fin base.

In an embodiment, the unwanted fin(s) may include a hard mask, and the conformal protective layer resides over the hard mask. In this configuration, the removing a portion of the unwanted fin to expose a fin spike includes removing the hard mask from the unwanted fin(s) exposed through the opening(s) in the photoresist. The multiple fins may further include semiconductor material, and the removing exposes the semiconductor material of the unwanted fin(s). The method further includes subsequently selectively removing the semiconductor material from the unwanted fin(s). During this process, the conformal protective layer protects the one or more remaining fins. After selectively removing the semiconductor material of the unwanted fin(s), and thereby effectively removing the unwanted fin(s), the conformal protective layer may be removed from the remaining fin(s). In an embodiment, the conformal protective layer is, for example, conformally deposited to a thickness less than or equal to 5 nanometers (nm), for example, to a thickness less than or equal to 3 nm. As one example, the conformal protective layer may be an oxide layer formed over the multiple fin structures disposed on the substrate.

Figure 2:
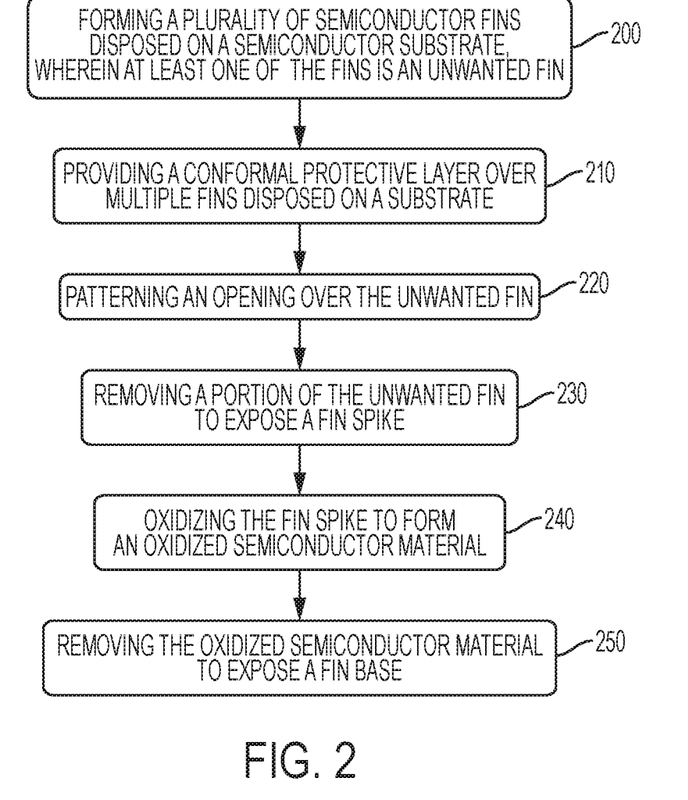
FIG. 2 depicts an embodiment of a fin cut process, in accordance with one or more aspects of the present disclosure.

FIG. 2 depicts a process overview of an embodiment of the single fin cut—partial fins oxidation method disclosed herein. Referring to FIG. 2, the process includes forming a plurality of semiconductor fins disposed on a semiconductor substrate, wherein at least one of the fins is an unwanted fin 200 including a semiconductor material. A conformal protective layer is then provided over the plurality of semiconductor fins 210. One or more openings are then patterned over one or more unwanted fins of the plurality of semiconductor fins 220. The protective layer and the hard mask of the unwanted fin(s) exposed through the opening(s) are then removed to expose the semiconductor material of the unwanted fin(s) 220. The patterning photoresist, and planarization layer over the multiple fins structures is then removed, followed by selective removal of the semiconductor material of the at least one unwanted fin, thereby removing the unwanted fin to expose a fin spike 230. The fin spike of the unwanted semiconductor fin is then oxidized to form an oxidized semiconductor material 240, which is subsequently removed to expose a fin base 250. The conformal protective layer may be removed, either prior to or after the removal of the oxidized semiconductor material, from the remaining fin(s) of the multiple fins formed in bulk during FINFET fabrication processing.

Figure 3A:
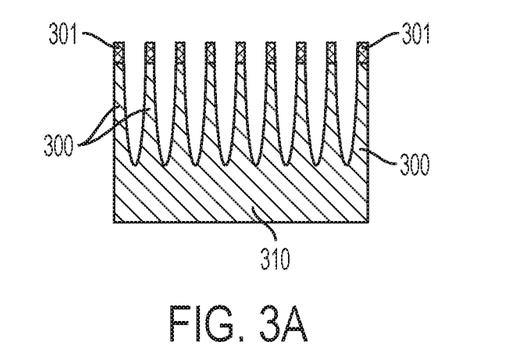
FIG. 3A depicts an embodiment of an intermediate structure including multiple fins obtained during bulk FINFET formation, in accordance with one or more aspects of the present disclosure.

FIGS. 3A-3I illustrate another example of such process. As shown in FIG. 3A, an intermediate structure is obtained during bulk FINFET fabrication processing, which includes multiple fins 300 disposed on a substrate 310. In an embodiment, the fins 300 may be formed by removing material from the substrate 310, resulting in the illustrated, spaced fin structures 300. This removal processing may be facilitated by provision of a hard mask 301 patterned to provide the desired fin structure configurations. By way of an example, the intermediate structure illustrated may have fin structures which are 10-25 nm wide and (for example) 100-200 nm high, from the substrate 310. In one bulk FINFET fabrication process, a large number of such fins are formed concurrently. Depending on the circuit or device being fabricated, in certain areas the fins will be needed, and in other areas, the fins will need to be removed. This removal of the fins is referred to as the fin cut process. In an example, the semiconductor material of the substrate and the fins is or includes silicon. Further, by way of an example, the hard mask 301 may be a nitride, with a thickness (for example) of 30-50 nm.

Figure 3B:
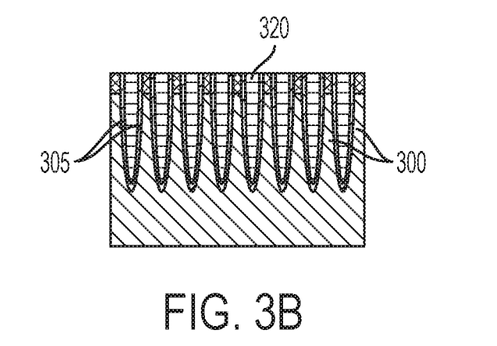
FIG. 3B depicts the intermediate structure of FIG. 3A after provision of a conformal protective layer and planarization material over the multiple fins, in accordance with one or more aspects of the present disclosure.

FIG. 3B depicts the intermediate structure of FIG. 3A, after provision of a conformal protective layer 305 over the multiple fins. In an example, the conformal protective layer has a thickness less than or equal to 5 nm, and in another example, a thickness less than or equal to 3 nm. In an embodiment, the protective layer is conformally provided over the multiple fins.

Figure 3C:
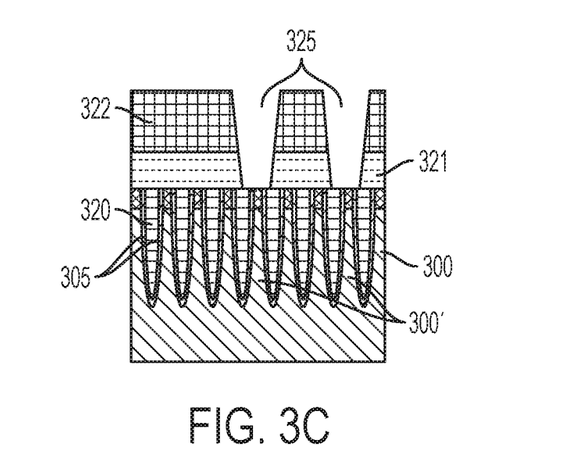
FIG. 3C depicts the intermediate structure of FIG. 3B after provision of an anti-reflective coating and patterning of a photoresist to provide an opening over one or more unwanted fins, in accordance with one or more aspects of the present disclosure.

To facilitate opening or removal of the hard mask and conformal protective layer over the unwanted fin(s), a planarization material 320 is provided over the multiple fins 300, as further illustrated in FIG. 3B. This planarization material (or layer) may be, for example, an optical dispersion layer (ODL) with a thickness over the fins of 100-135 nm. As illustrated in FIG. 3C, an anti-reflective coating 321 may then be applied, followed by a photoresist 322, which may be patterned with one or more openings 323. The one or more openings 323 align over one or more unwanted fins 300' to be removed. As an example, the anti-reflective coating (ARC) may have a thickness of 30-50 nm, and the photoresist may have a thickness of approximately 100 nm.

Figure 3D:
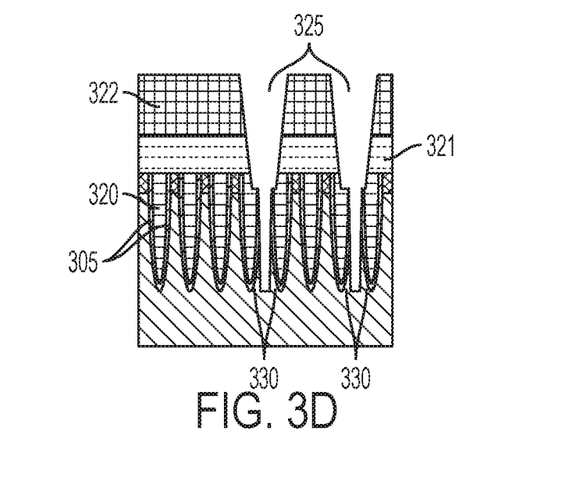
FIG. 3D depicts the intermediate structure of FIG. 3C after removal of planarization material, hard mask, the conformal protective layer, and the unwanted fins, in accordance with one or more aspects of the present disclosure.

As shown in FIG. 3D, at least a portion of the protective layer, as well as the hard mask, are then removed from the unwanted fin(s) 300', for example, by dry-etching through the patterned photoresist to provide a deepened opening 325 in the intermediate structure. Wet OPL removal may then be employed to remove the photoresist, anti-reflective coating, and planarization layer, resulting in the structure, wherein the semiconductor material within the unwanted fin(s) 300' is exposed, and the remaining fins 300 are protected by the conformal protective layer 305.

Figure 3E:
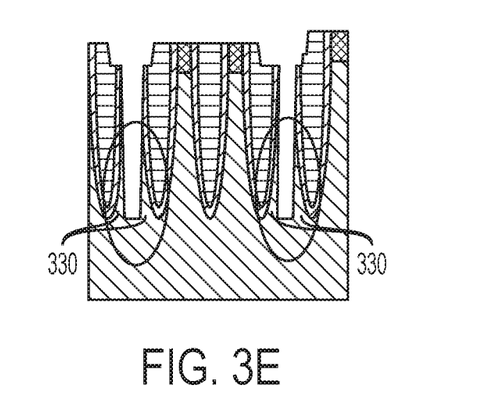
FIG. 3E is a magnified version of FIG. 3D depicting the semiconductor material spikes remaining after the removal of the unwanted fin, in accordance with one or more aspects of the present disclosure.
Figure 3F:
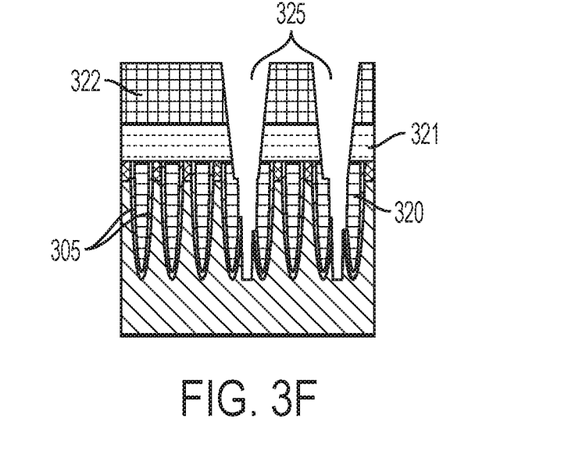
FIG. 3F depicts the intermediate structure of FIG. 3E after the selective removal of the conformal protective layer, in accordance with one or more aspects of the present disclosure.
Figure 3G:
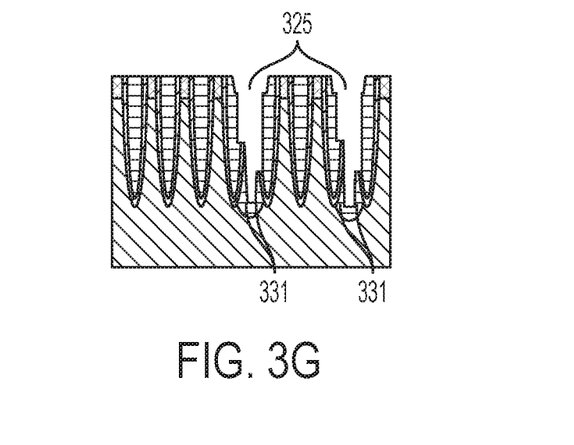
FIG. 3G depicts the intermediate structure of FIG. 3F after the oxidation of the remaining semiconductor material spikes, in accordance with one or more aspects of the present disclosure.
Figure 3H:
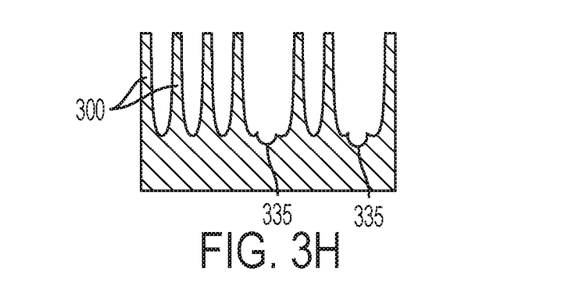
FIG. 3H depicts the intermediate structure of FIG. 3G after the removal of the conformal protective layer, the planarization material, and the oxidized semiconductor material of the spikes.
Figure 3I:
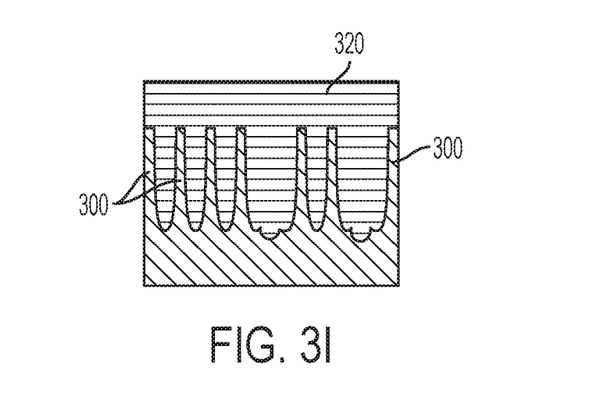
FIG. 3I depicts the intermediate structure of FIG. 3H after re-filling the fin trenches with planarization material.

As further shown in FIG. 3D, the unwanted fin(s), and in particular the semiconductor material of the unwanted fin(s), may then be removed using a selective wet-etch (such as a TMAH or KOH anisotropic wet-etch) or a highly-selective, iso-dry-etch (such as a $HBr/O_2/Cl_2$ chemistry etch in a microwave or remote plasma/downstream etch) to leave, at least in some cases, semiconductor spikes 330 (FIG. 3E). The dry-etching of the conformal protective layer 305 may then be repeated (FIG. 3F). An oxidation process may be performed to oxidize the remaining spikes 330 of the unwanted fins in the opening 323 of the photoresist pattern into oxidized fin spikes 331 (FIG. 3G). In an example, the oxidation may be conducted by steam oxidation. When the remaining spikes include silicon, the oxidized fin spikes may include silicon oxide. Then, the planarization material 320 may be removed and the oxidized fin spikes 331 may also be removed to expose a fin base 335 (FIG. 3H). A new portion of the planarization material 320 may be subsequently provided (FIG. 3I).

The disclosed herein process can be applied to scaling of FINFET structures beyond 10 nm mode when fin pitch is expected to be below 40 nm, wherein the partially cut fins can be conveniently removed through semiconductor oxidation. The process adds only a limited number of steps and is fully compatible with the methods of FINFET structure fabrication. This process eliminates residual fins which may lead to higher parasitic capacitance in the final FinFET device. Parasitic capacitance is known to delay FinFET CMOS performance speed.

Referring to FIGS. 1F and 3H, provided herein is a semiconductor device, including:

a substrate extending in a first direction to define a substrate length and a second direction perpendicular to the first direction to define a substrate width;

a first semiconductor fin formed on an upper surface of the substrate, the first semiconductor fin extending along the second direction;

a second semiconductor fin formed on an upper surface of the substrate, the second semiconductor fin extending along the second direction; and a third semiconductor fin formed on an upper surface of the substrate and disposed between the first semiconductor fin and the second semiconductor fin, wherein the third semiconductor fin extends along the second direction at a first distance from the first semiconductor fin and at a second distance from the second semiconductor fin, wherein the first distance and the second distance are different.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

The invention claimed is:

1. A method of fabricating a semiconductor device, the method comprising:

forming a plurality of semiconductor fins disposed on a semiconductor substrate, wherein at least one of the fins is an unwanted fin comprising a semiconductor material;

providing a conformal protective layer over the plurality of semiconductor fins;

forming a mask having an opening over the unwanted fin;

removing a portion of the unwanted fin to form a trench exposing a surface of the substrate and a sidewall of a fin spike, a portion of the conformal protective layer remaining over a topmost surface of the fin spike, wherein a second sloped portion of the unwanted fin that is not removed defines the fin spike;

oxidizing the fin spike to form an oxidized semiconductor material;

removing the oxidized semiconductor material to expose a fin base, wherein the exposed fin base comprises a cavity in the substrate; and removing the portion of the conformal protective layer.

2. The method of claim 1, wherein the unwanted fin comprises a hard mask disposed below the conformal protective layer, and wherein the removing the portion of the unwanted fin to expose the fin spike comprises removing the hard mask from the unwanted fin exposed through the opening.

3. The method of claim 1, wherein the removing the portion of the unwanted fin to expose the fin spike exposes the semiconductor material of the unwanted fin.

4. The method of claim 1, wherein the removing the oxidized semiconductor material to expose the fin base comprises removing the oxidized semiconductor material of the unwanted fin.

5. The method of claim 1, wherein the conformal protective layer protects remaining fins of the plurality of semiconductor fins while oxidizing the fin spike to form the oxidized semiconductor material and while removing the oxidized semiconductor material of the unwanted fin.

6. The method of claim 1, further comprising:

removing the conformal protective layer from the remaining fins, after the removing the oxidized semiconductor material of the unwanted fin.

7. The method of claim 1, wherein the oxidizing is conducted by steam oxidation.

8. The method of claim 1, wherein both the unwanted fin and the semiconductor substrate comprise a same semiconductor material.

9. The method of claim 8, wherein the semiconductor material comprises silicon.

10. The method of claim 1, wherein the oxidized semiconductor material comprises silicon oxide.

11. The method of claim 1, wherein the providing the conformal protective layer comprises:
providing the conformal protective layer over the plurality of semiconductor fins with a thickness less than or equal to about 5 nanometers.

12. The method of claim 1, wherein the patterning further comprises providing a photoresist layer over a planarization material, and
wherein the opening over the unwanted fin extends through the photoresist layer.

13. The method of claim 12, wherein the patterning further comprises:
providing an anti-reflective coating between the planarization material and the photoresist layer, and
wherein the opening over the unwanted fin extends through the photoresist layer and the anti-reflective coating, at least partially into the planarization material.

14. The method of claim 13, wherein the unwanted fin comprises a hard mask disposed below the conformal protective layer, and
wherein the removing the portion of the unwanted fin to expose the fin spike comprises removing the hard mask from the unwanted fin exposed through the opening.

15. The method of claim 14, wherein the removing the portion of the unwanted fin to expose the fin spike exposes the semiconductor material of the unwanted fin; and
wherein the removing the oxidized semiconductor material to expose the fin base comprises removing the oxidized semiconductor material of the unwanted fin, wherein the conformal protective layer protects remaining fins of the plurality of semiconductor fins during removing the oxidized semiconductor material of the unwanted fin.

16. The method of claim 15, further comprising:
removing the conformal protective layer from the remaining fins, after the removing the oxidized semiconductor material of the unwanted fin.

17. A method of fabricating a semiconductor device, the method comprising:
forming a plurality of semiconductor fins disposed on a semiconductor substrate, wherein at least one of the fins is an unwanted fin comprising a semiconductor material;
providing a conformal protective layer over the plurality of semiconductor fins;
forming a mask having an opening over the unwanted fin;
removing a portion of the conformal protective layer over the unwanted fin exposed through the opening;
removing a portion of the unwanted fin exposed through the opening to form a trench exposing a surface of the substrate and a sidewall of a fin spike, a second portion of the conformal protective layer remaining over a topmost surface of the fin spike, wherein a second portion of the unwanted fin that is not removed defines a sloped portion of the fin spike;
oxidizing the fin spike to form an oxidized semiconductor material;
removing the oxidized semiconductor material to expose a fin base, wherein the exposed fin base comprises a cavity in the substrate; and
removing the second portion of the conformal protective layer.

18. The method of claim 17, wherein the unwanted fin comprises a hard mask disposed under the conformal protective layer, and
wherein the removing the portion of the unwanted fin to expose the fin spike comprises dry-etching the hard mask from the unwanted fin exposed through the opening.

19. The method of claim 18, wherein the removing the portion of the unwanted fin to expose the fin spike exposes the semiconductor material of the unwanted fin; and
wherein the method further comprises:
selectively wet-etching the semiconductor material of the unwanted fin, wherein the conformal protective layer protects remaining fins of the plurality of fins during the selective wet-etching of the semiconductor material of the unwanted fin; and
removing the conformal protective layer from the remaining fins, after the removing the oxidized semiconductor material of the unwanted fin.

* * * * *